United States Patent
Murata

(10) Patent No.: US 9,240,282 B2
(45) Date of Patent: Jan. 19, 2016

(54) VARIABLE CAPACITOR

(71) Applicant: ALPS ELECTRIC CO., LTD., Tokyo (JP)

(72) Inventor: Shinji Murata, Niigata-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 326 days.

(21) Appl. No.: 14/066,498

(22) Filed: Oct. 29, 2013

(65) Prior Publication Data
US 2014/0055908 A1 Feb. 27, 2014

Related U.S. Application Data

(63) Continuation of application No. PCT/JP2012/053256, filed on Feb. 13, 2012.

(30) Foreign Application Priority Data

Jun. 2, 2011 (JP) .................. 2011-124382

(51) Int. Cl.
H01G 7/06 (2006.01)
H01G 5/16 (2006.01)
H01G 5/38 (2006.01)
H01G 5/18 (2006.01)
B81B 3/00 (2006.01)

(52) U.S. Cl.
CPC ............... *H01G 5/16* (2013.01); *B81B 3/0056* (2013.01); *H01G 5/18* (2013.01); *H01G 5/38* (2013.01); *B81B 2201/0221* (2013.01)

(58) Field of Classification Search
USPC ......................... 361/277, 280, 281
See application file for complete search history.

(56) References Cited

U.S. PATENT DOCUMENTS

| 6,833,985 B2 * | 12/2004 | Fuji ..................... H01H 59/0009 361/278 |
| 2002/0131230 A1 * | 9/2002 | Potter ...................... H01G 5/16 361/277 |
| 2002/0173060 A1 | 11/2002 | Hiroki |
| 2008/0106843 A1 | 5/2008 | Murata |

FOREIGN PATENT DOCUMENTS

| JP | 9-55337 | 2/1997 |
| JP | 2003-264123 | 9/2003 |
| JP | 2009-59866 | 3/2009 |
| JP | 2010-273382 | 12/2010 |
| JP | 2011-108989 | 6/2011 |

OTHER PUBLICATIONS

Search Report dated Apr. 24, 2012 from International Application No. PCT/JP2012/053256.

* cited by examiner

Primary Examiner — Eric Thomas
(74) Attorney, Agent, or Firm — Beyer Law Group LLP

(57) ABSTRACT

A variable capacitor includes a plurality of variable capacitor elements connected in parallel with one another, the variable capacitor elements each including a fixed electrode and a movable electrode facing each other, a beam supporting the movable electrode displaceably, and a drive electrode supplied with a drive voltage to change spacing between the fixed electrode and the movable electrode. The variable capacitor further includes a drive control unit configured to sequentially apply an AC drive voltage to the drive electrodes of the variable capacitor elements with a predetermined phase difference for each element. The sum of capacitances of the variable capacitor elements is an output capacitance.

6 Claims, 10 Drawing Sheets

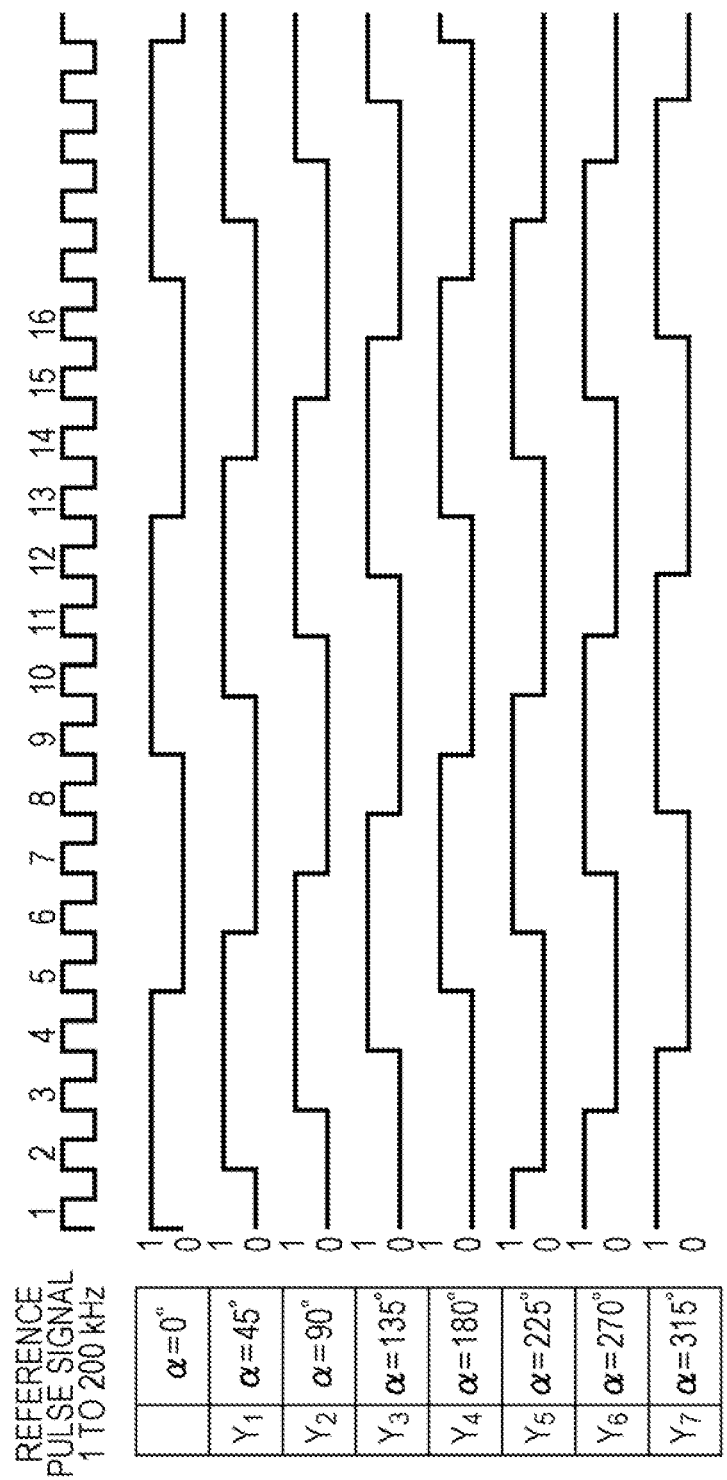

VARIABLE CAPACITOR

CLAIM OF PRIORITY

This application is a Continuation of International Application No. PCT/JP2012/053256 filed on Feb. 13, 2012, which claims benefit of Japanese Patent Application No. 2011-124382 filed on Jun. 2, 2011. The entire contents of each application noted above are hereby incorporated by reference.

BACKGROUND OF THE INVENTION

1. Field of the Invention

The present invention relates to a variable capacitor in which spacing between a fixed electrode and a movable electrode facing each other varies depending on voltage applied.

2. Description of the Related Art

A variable capacitor included in an oscillator circuit or a modulator circuit of, for example, a mobile phone, can change a capacitance so that the circuit yields a desired output. Such a capacitor has recently been achieved using microelectromechanical systems (MEMS) technology. Specifically, the MEMS variable capacitor includes a fixed electrode, a movable electrode facing the fixed electrode with a predetermined spacing therebetween, a beam supporting the movable electrode displaceably relative to the fixed electrode, and a drive electrode for applying a drive voltage between the fixed electrode and the movable electrode. The MEMS variable capacitor is configured such that a force (e.g., electrostatic force, magnetic force, or piezoelectric force) generated between the fixed electrode and the movable electrode upon application of the drive voltage causes the movable electrode to be displaced, the spacing between the fixed electrode and the movable electrode facing each other accordingly varies, and the capacitance therefore changes.

Related-art variable capacitors are of DC-drive type in which a DC drive voltage is applied between the fixed electrode and the movable electrode, as disclosed in Japanese Unexamined Patent Application Publication No. 9-55337, for example. Accordingly, a high drive voltage is necessary to achieve a large change in capacitance of the variable capacitor. Disadvantageously, this leads to increased power consumption. Additionally, a step-up circuit for generating such a high voltage is also required. Unfortunately, an apparatus is inevitably increased in size. Since portable apparatuses are, however, always required to have small size and low profile, including such a variable capacitor is a disadvantage in terms of achieving small size and low profile. Furthermore, if a variable capacitor element is configured to include a dielectric layer deposited on an upper surface or lower surface of the fixed electrode or the movable electrode, continuous application of a high voltage between the fixed electrode and the movable electrode may cause the dielectric layer to be charged such that the fixed electrode will be attached to the movable electrode. Disadvantageously, the variable capacitor element may fail to function.

To overcome the above-described disadvantages caused by DC driving, an AC drive voltage may be used instead of a DC drive voltage. In the use of the AC drive voltage, since the drive voltage to be applied between the fixed electrode and the movable electrode fluctuates, the movable electrode vibrates in directions close to and away from the fixed electrode. This causes ripple in the capacitance of the variable capacitor. Unfortunately, such a capacitor is difficult to use as a circuit element.

SUMMARY OF THE INVENTION

The present invention has been made in consideration of the above-described disadvantages and provides a variable capacitor capable of being driven at a low voltage and yielding a stable capacitance while reducing ripple.

The present invention has been made by focusing on that the use of an AC drive voltage can achieve low-voltage driving and prevention of attachment of a fixed electrode and a movable electrode, and driving a plurality of variable capacitor elements connected in parallel with a predetermined phase difference can combine capacitances of the variable capacitor elements while reducing ripple to yield a stable output capacitance.

This invention provides a variable capacitor including a plurality of variable capacitor elements connected in parallel with one another, the variable capacitor elements each including a fixed electrode and a movable electrode facing each other, a beam supporting the movable electrode displaceably, and a drive electrode supplied with a drive voltage to change spacing between the fixed electrode and the movable electrode facing each other. The variable capacitor further includes a drive control unit configured to sequentially apply an AC drive voltage to the drive electrodes of the variable capacitor elements with a predetermined phase difference for each element. The sum of capacitances of the variable capacitor elements is an output capacitance.

Preferably, the drive control unit applies the voltage to each drive electrode to generate an electrostatic force between the fixed electrode and the movable electrode, thereby changing the spacing between the fixed electrode and the movable electrode.

Preferably, the variable capacitor elements each include a dielectric deposited on at least one surface of the fixed electrode or the movable electrode. In the case where the variable capacitor elements each include the dielectric, since the use of the AC drive voltage allows creation of a moment at which charging of the dielectric is reset (to zero), the movable electrode can be prevented from being attached to the fixed electrode.

Preferably, a frequency of the drive voltage applied to the drive electrodes of the variable capacitor elements by the drive control unit is a resonant frequency of the movable electrode determined by the beam or a frequency different from the resonant frequency within a predetermined range. In this case, the effect of multiplication by the resonance of the movable electrode yields a large displacement of the movable electrode in low-voltage driving. Advantageously, a high change rate can be provided.

The drive control unit may set the phase difference for each variable capacitor element to 360° divided by the number of elements.

BRIEF DESCRIPTION OF THE DRAWINGS

FIG. 9 is a timing chart illustrating driving control timing (phase difference α=45°) for the variable capacitor of FIG. 4;

DESCRIPTION OF THE PREFERRED EMBODIMENTS

Figure 1:
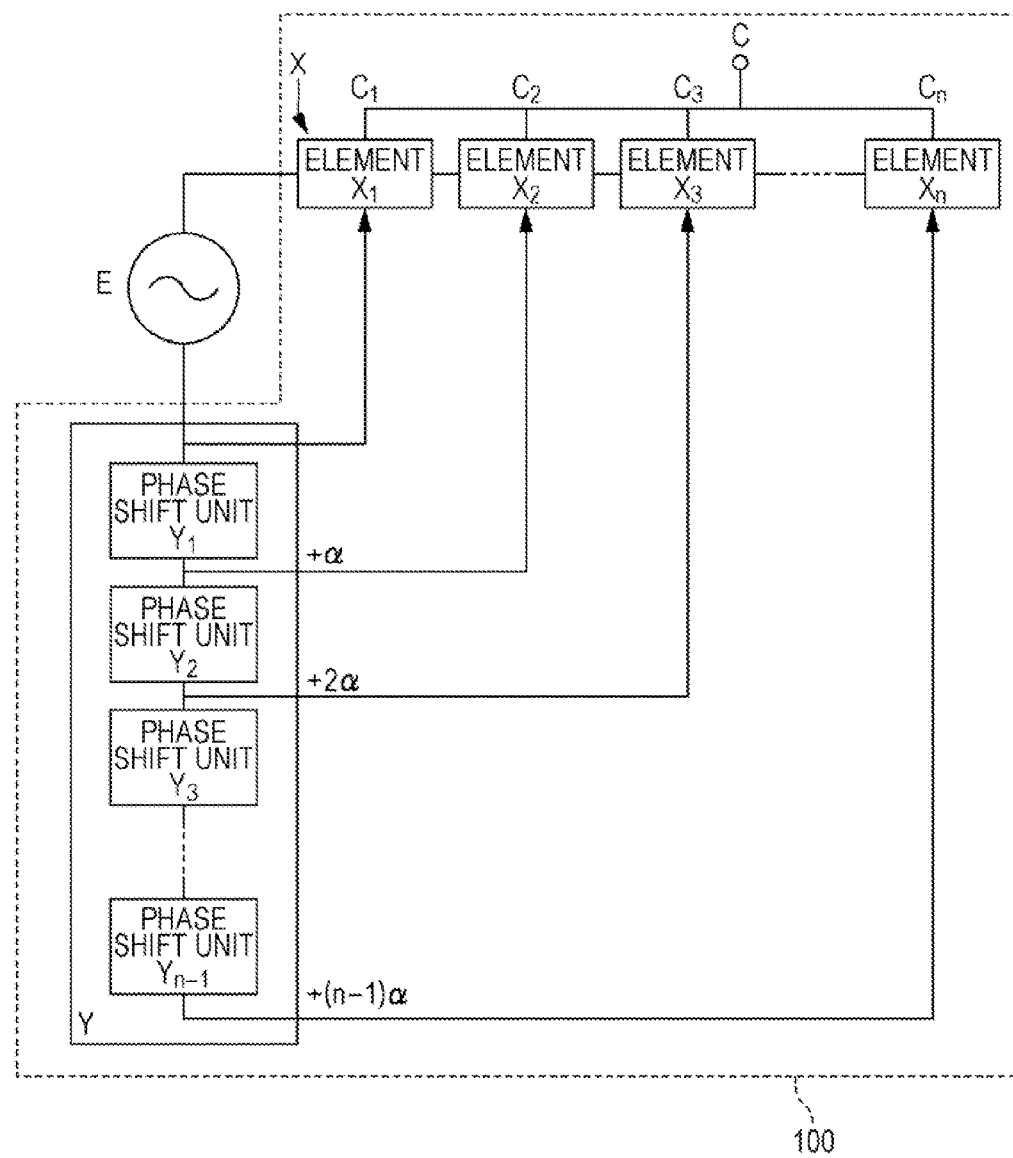
FIG. 1 is a schematic block diagram illustrating an entire configuration of a variable capacitor according to the invention.

FIG. 1 is a schematic block diagram illustrating an entire configuration of a variable capacitor according to the present invention. A variable capacitor 100 includes a plurality of variable capacitor elements X ($X_1$ to $X_n$; n is an integer) connected in parallel with one another and a multistage phase shifter Y. The multistage phase shifter Y is a drive control unit for the variable capacitor elements $X_1$ to $X_n$ and includes a plurality of phase shift units $Y_1$ to $Y_{n-1}$ to apply an AC drive voltage supplied from an external AC power supply E to the variable capacitor element $X_1$, sequentially shift the drive voltage by a predetermined phase difference α, and apply the shifted drive voltages to the respective variable capacitor elements $X_2$ to $X_n$.

Figure 2A:
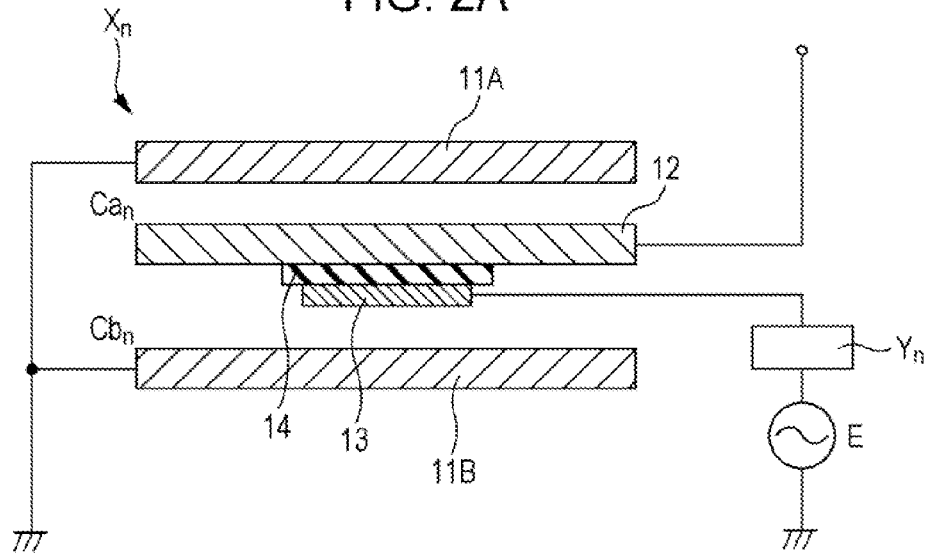
FIG. 2A is a schematic diagram illustrating, in outline, the configuration of a variable capacitor element according to a first embodiment.

FIGS. 2A to 9 illustrate the variable capacitor element Xn according to a first embodiment. FIG. 2A is a schematic diagram illustrating, in outline, the configuration of the variable capacitor element $X_n$. FIG. 2B is a circuit diagram of the variable capacitor element $X_n$. FIG. 2C is an equivalent circuit diagram of the variable capacitor element $X_n$ of FIG. 2B. According to the first embodiment, the variable capacitor element $X_n$ includes a pair of first and second fixed electrodes 11A and 11B, a movable electrode (capacitance formation electrode) 12 disposed therebetween, and a drive electrode 13 connected to the multistage phase shifter Y, the drive electrode 13 being disposed close to the movable electrode 12. The movable electrode 12 is electrically insulated from the drive electrode 13 by a dielectric layer 14 made of, for example, $SiO_2$.

In this variable capacitor element $X_n$, while any voltage is not applied to the drive electrode 13, the movable electrode 12 is held at an intermediate position between the pair of fixed electrodes 11A and 11B by spring force of beams 10b2 (refer to FIGS. 5 to 7F) supporting the movable electrode 12 displaceably, such that spacing between the first fixed electrode 11A and the movable electrode 12 is held equal to that between the second fixed electrode 11B and the movable electrode 12. Specifically, a first capacitance $Ca_n$ formed between the first fixed electrode 11A and the movable electrode 12 is equal to a second capacitance $Cb_n$ formed between the second fixed electrode 11B and the movable electrode 12. FIG. 2A illustrates such a state with no voltage applied. When an AC drive voltage is applied to the drive electrode 13 through the multistage phase shifter Y, an electrostatic force is generated between the movable electrode 12 and the second fixed electrode 11B and this electrostatic force causes the movable electrode 12 to be displaced. The generated electrostatic force is not constant, but fluctuates depending on the magnitude of the AC voltage applied. Accordingly, the movable electrode 12 vibrates up and down in FIG. 2A. The spacing between the first fixed electrode 11A and the movable electrode 12 and the spacing between the second fixed electrode 11B and the movable electrode 12 change in accordance with the vibration. Consequently, the first capacitance $Ca_n$ and the second capacitance $Cb_n$ also change. Specifically, when the movable electrode 12 is displaced in a direction close to the second fixed electrode 11B (downward in FIG. 2A), the spacing between the movable electrode 12 and the second fixed electrode 11B decreases and the second capacitance $Cb_n$ increases. The spacing between the movable electrode 12 and the first fixed electrode 11A increases and the first capacitance $Ca_n$ decreases. On the other hand, when the movable electrode 12 is displaced in a direction away from the second fixed electrode 11B (upward in FIG. 2A), the spacing between the movable electrode 12 and the second fixed electrode 11B increases and the second capacitance $Cb_n$ decreases. The spacing between the movable electrode 12 and the first fixed electrode 11A decreases and the first capacitance $Ca_n$ increases. When the application of voltage to the drive electrode 13 is stopped, the movable electrode 12 is returned to the intermediate position between the pair of fixed electrodes 11A and 11B by spring force of the beams 10b2 (refer to FIGS. 5 to 7F).

Figure 2B:
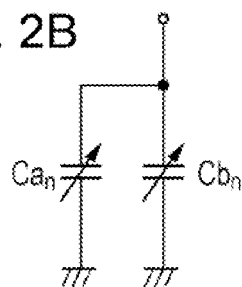
FIG. 2B is a circuit diagram of the variable capacitor element.
Figure 2C:
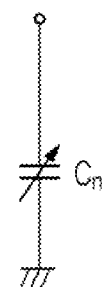
FIG. 2C is an equivalent circuit diagram thereof.

As illustrated in FIG. 2B and FIG. 2C, the first capacitance $Ca_n$ and the second capacitance $Cb_n$ have an electrically parallel relationship. A combined capacitance of the first capacitance $Ca_n$ and the second capacitance $Cb_n$ is a capacitance $C_n$ of the variable capacitor element $X_n$ ($C_n=Ca_n+Cb_n$).

Figure 3:
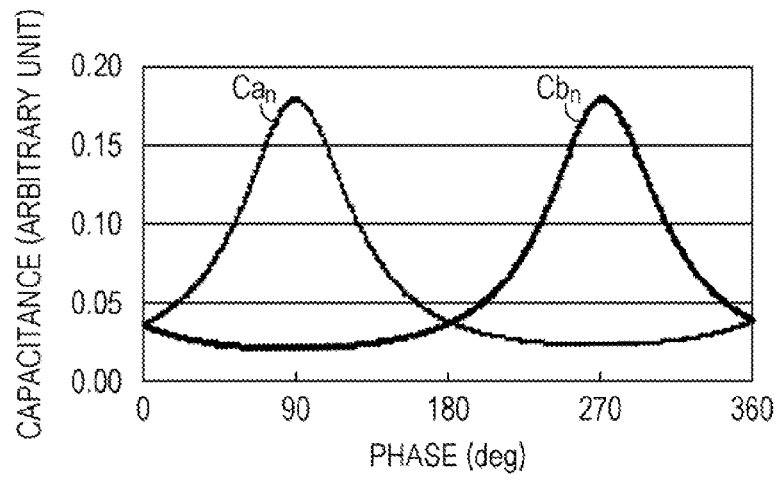
FIG. 3 is a graph illustrating a change in phase of the capacitance of the variable capacitor element of FIGS. 2A to 2C.

FIG. 3 is a graph illustrating a change in phase of the capacitance $C_n$ of the variable capacitor element $X_n$. As illustrated in FIG. 3, a change in the first capacitance $Ca_n$ and that in the second capacitance $Cb_n$ have a phase difference of 180°. The capacitance $C_n$, serving as the combined capacitance, of the variable capacitor element $X_n$ has two peak values during one period (360°).

Figure 4:
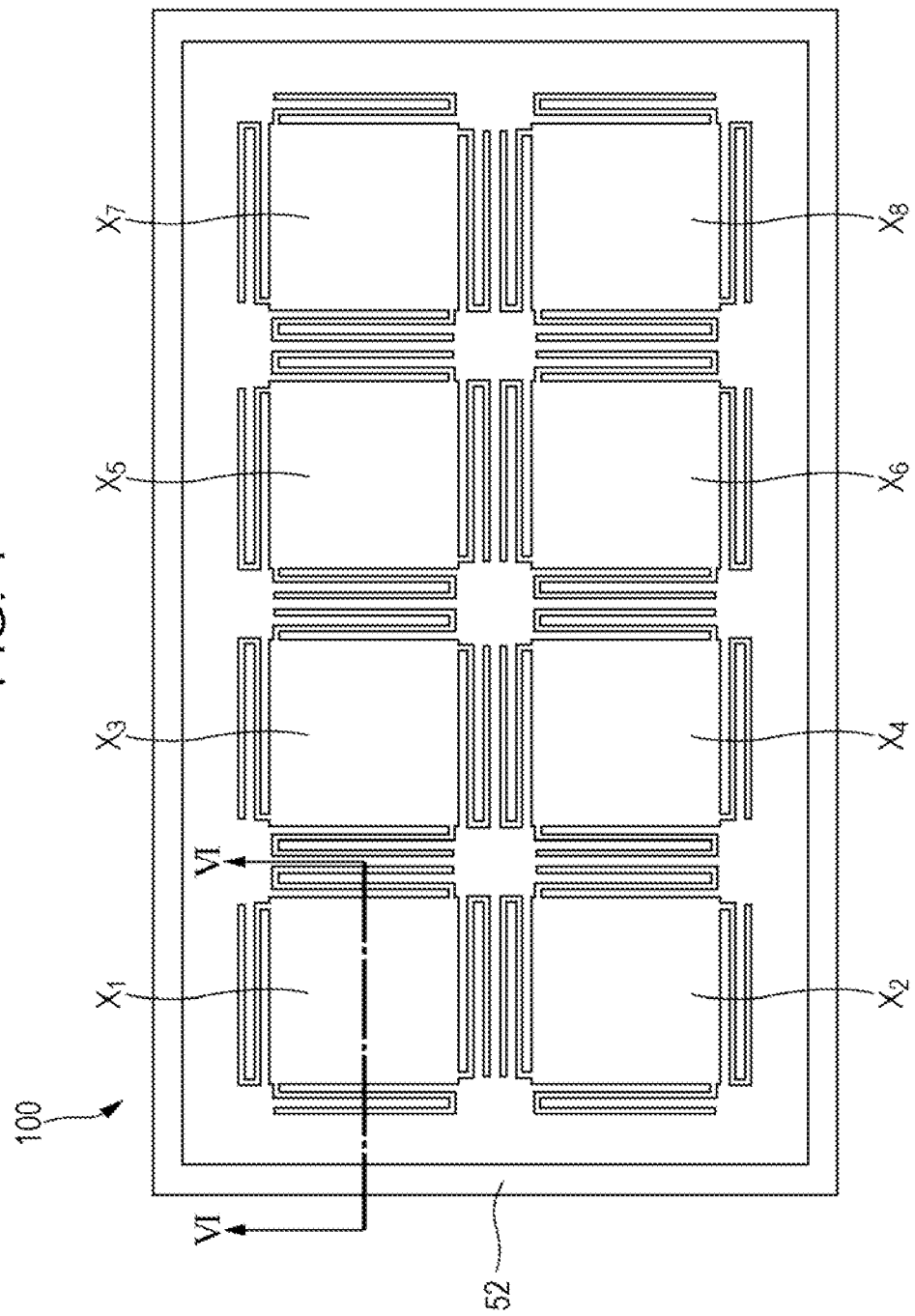
FIG. 4 is a plan view illustrating a variable capacitor including eight variable capacitor elements.
Figure 5:
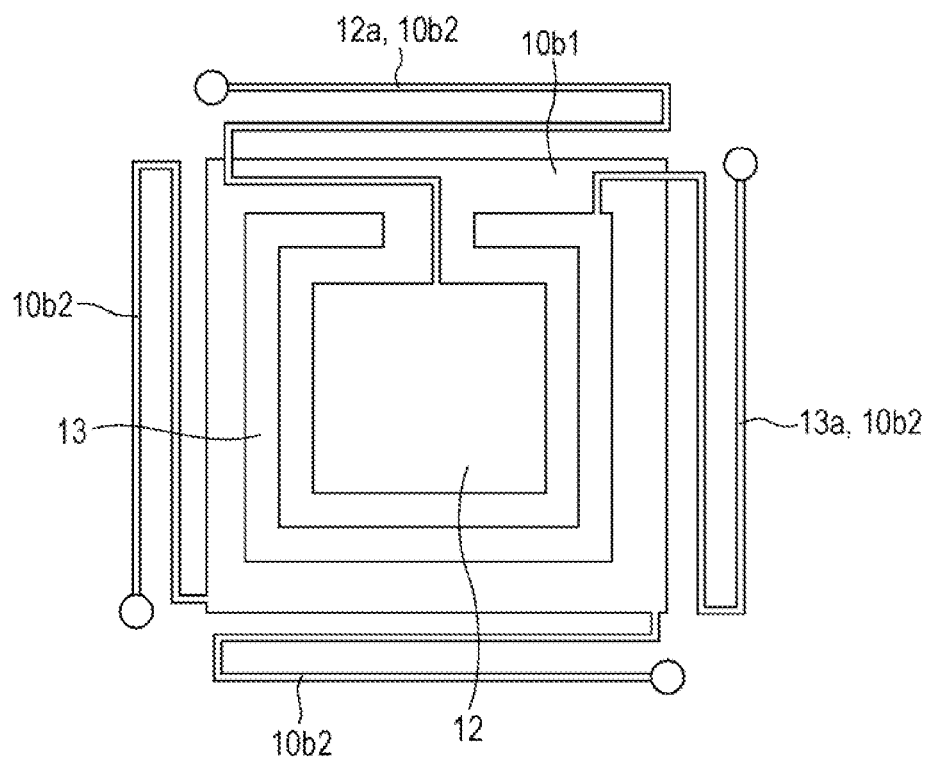
FIG. 5 is an enlarged view of part of the variable capacitor of FIG. 4.
Figure 6:
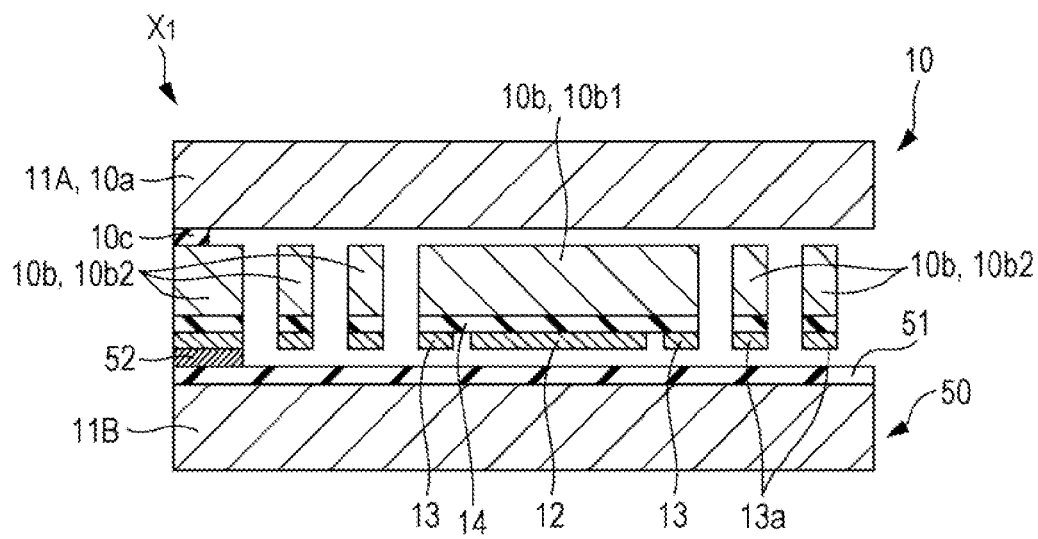
FIG. 6 is a sectional view taken along line VI-VI in FIG. 4.

A more specific exemplary configuration of the variable capacitor element $X_n$ will be described with reference to FIGS. 4 to 8B. FIG. 4 is a plan view illustrating a variable capacitor including eight variable capacitor elements $X_1$ to $X_8$ (n=8). FIG. 5 is an enlarged view of part of the variable capacitor of FIG. 4. FIG. 6 is a sectional view taken along line VI-VI in FIG. 4. FIGS. 7A to 8B are sectional views illustrating steps of making the variable capacitor element $X_n$ in FIGS. 5 and 6.

The eight variable capacitor elements $X_1$ to $X_8$ are arranged in a two-dimensional array as illustrated in FIG. 4 and include an upper substrate 10 and a lower substrate 50 as illustrated in FIG. 6.

The upper substrate 10 is a silicon-on-insulator (SOI) substrate and includes a first Si substrate 10a, a second Si substrate 10b, and a $SiO_2$ layer 10c disposed therebetween. The first Si substrate 10a functions as the first fixed electrode 11A and is connected to ground. The second Si substrate 10b is covered with the dielectric layer 14 made of $SiO_2$. The movable electrode 12 and the drive electrode 13 are arranged as a thin layer on the dielectric layer 14. The dielectric layer of SiO$_2$ may be deposited on a surface of the first Si substrate 10a facing the second Si substrate 10b.

As illustrated in FIG. 5, the movable electrode 12 is flat and rectangular in shape and is disposed in flat rectangular central part 10b1 of the second Si substrate 10b such that the shape of the movable electrode 12 is smaller than that of the central part 10b1. The movable electrode 12 is connected via a wiring portion 12a to an output terminal of the variable capacitor element X$_n$. The drive electrode 13 is disposed in the central part 10b1 of the second Si substrate 10b so as to extend along edges of the central part 10b1 and edges of the movable electrode 12. The drive electrode 13 is connected via a wiring portion 13a to the multistage phase shifter Y.

The second Si substrate 10b has a thickness of approximately 10 µm and is flexible. The second Si substrate 10b includes the beams 10b2 which are linear parts extending outwardly from the respective edges of the central part 10b1. The second Si substrate 10b is connected to the first Si substrate 10a and the lower substrate 50 at ends of the beams 10b2. Specifically, the central part 10b1 is displaceably supported by the beams 10b2. The wiring portion 12a of the movable electrode 12 and the wiring portion 13a of the drive electrode 13 are arranged on two different beams 10b2 of the four beams 10b2 so as to be extended outwardly. The SiO$_2$ layer 10c except parts connecting the first Si substrate 10a and the beams 10b2 is removed. A portion where the SiO$_2$ layer 10c is removed serves as a gap between the first Si substrate 10a and the second Si substrate 10b. The gap has a distance corresponding to the thickness of the SiO$_2$ layer 10c and is 2 µm in the illustrated embodiment. The first Si substrate 10a, which has a thickness of approximately 100 µm, is sufficiently thicker than the second Si substrate 10b. Accordingly, if the second Si substrate 10b bends, the first Si substrate 10a does not follow the bending.

Figure 7A:
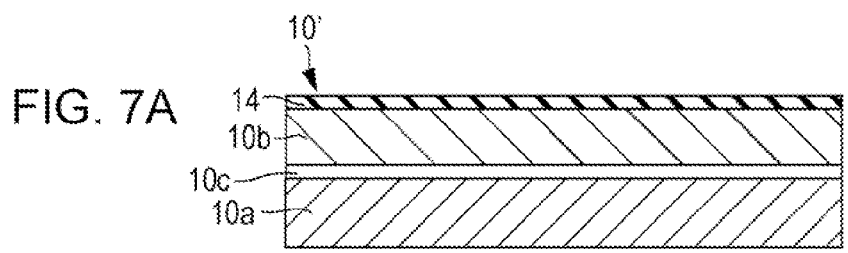
FIGS. 7A to 7F are sectional views explaining steps of making an upper substrate in FIG. 6.
Figure 7B:
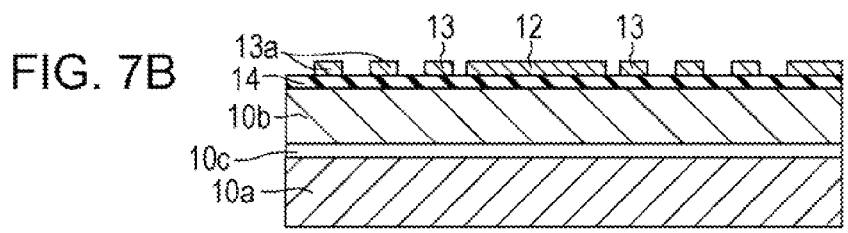
Figure 7C:
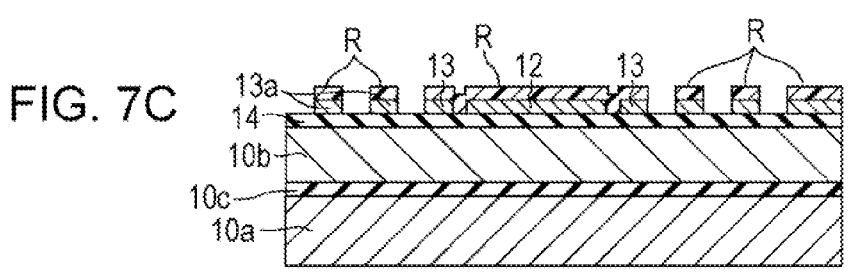
Figure 7D:
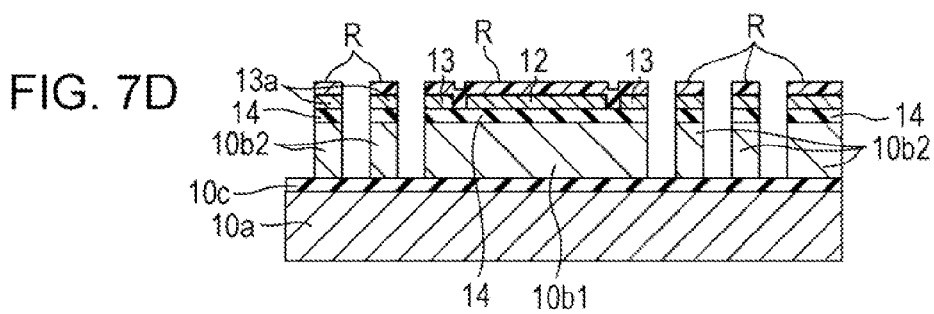
Figure 7E:
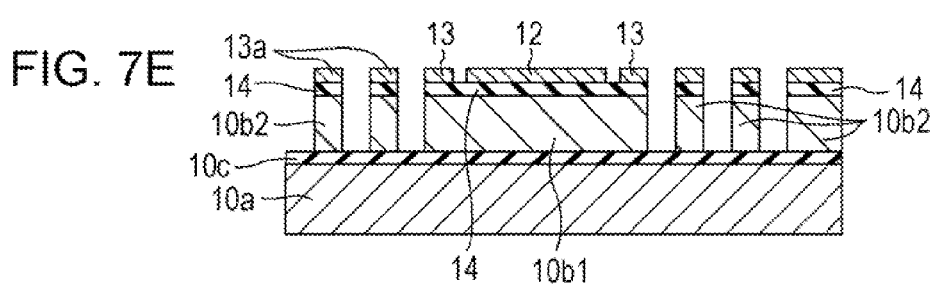
Figure 7F:
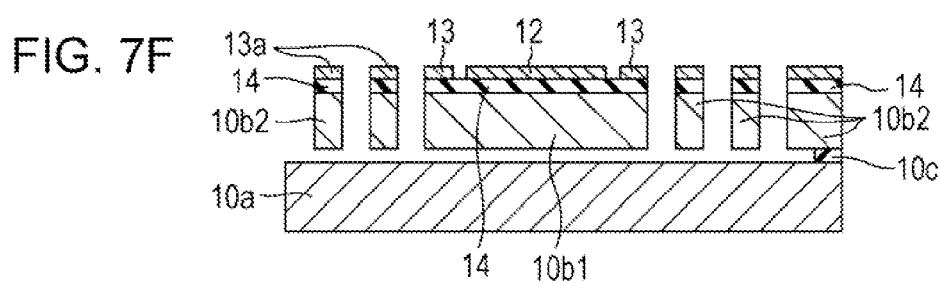

FIGS. 7A to 7F illustrate the steps of making the upper substrate 10. First, an SOI substrate 10' including the first Si substrate 10a, the second Si substrate 10b, and the SiO$_2$ layer 10c sandwiched therebetween is cleaned. Subsequently, as illustrated in FIG. 7A, the dielectric layer 14 of SiO$_2$ is formed at a thickness of approximately 1 µm on the second Si substrate 10b. Then, as illustrated in FIG. 7B, the movable electrode 12 and the drive electrode 13 are simultaneously formed on the dielectric layer 14 by resist patterning. As regards the movable electrode 12 and the drive electrode 13, for example, a Ti/Au layer can be used such that a sublayer of Ti has a thickness of approximately 1000 Å and a sublayer of Au has a thickness of approximately 1 µm. Subsequently, as illustrated in FIG. 7C, the movable electrode 12 and the drive electrode 13 are covered with a resist R. In this step, regions where the beams 10b2 (not illustrated) should be formed are also covered with the resist R. After that, etching is performed until the SiO$_2$ layer 10c becomes exposed as illustrated in FIG. 7D. Then, the resist R is removed as illustrated in FIG. 7E. Consequently, the dielectric layer 14 and the second Si substrate 10b which have not been covered with the resist R are removed. The remaining second Si substrate 10b includes the flat rectangular central part 10b1 on which the movable electrode 12 and the drive electrode 13 are arranged and the beams 10b2 which are elongate and extend from the respective edges of the central part 10b1. Furthermore, as illustrated in FIG. 7F, the SiO$_2$ layer 10c except parts (at the ends of the beams 10b2) connecting the first Si substrate 10a and the second Si substrate 10b is removed, thus forming the upper substrate 10 in FIG. 6.

Figure 8A:
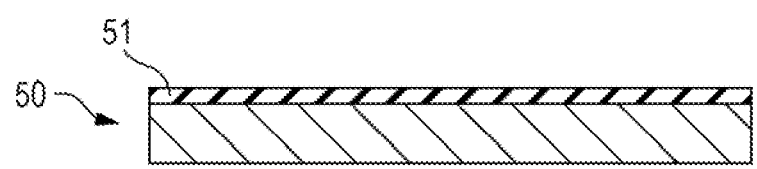
FIGS. 8A and 8B are sectional views explaining steps of making a lower substrate in FIG. 6.
Figure 8B:
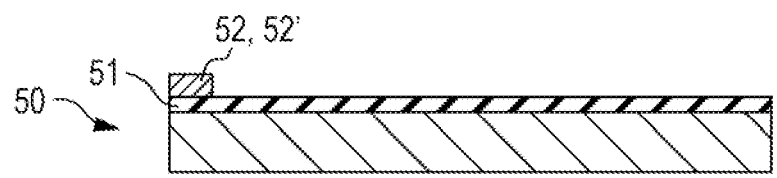

The lower substrate 50 includes a Si substrate having a thickness of approximately 100 µm, the Si substrate being connected to ground. The lower substrate 50 functions as the second fixed electrode 11B. FIGS. 8A and 8B illustrate steps of making the lower substrate 50. The lower substrate 50 is formed as follows: After the substrate is cleaned, a SiO$_2$ layer 51 is formed at a thickness of approximately 1 µm on the Si substrate as illustrated in FIG. 8A. A conductive pattern 52' is formed in a region to be connected to the upper substrate 10 as illustrated in FIG. 8B. The conductive pattern 52' serves as a connecting portion 52 connecting the upper substrate 10 and the lower substrate 50. This connecting portion 52 extends on end parts of the lower substrate 50 as illustrated in FIG. 4. As regards the conductive pattern 52', for example, a Ti/Au layer can be used such that a sublayer of Ti has a thickness of approximately 1000 Å and a sublayer of Au has a thickness of approximately 2 µm.

The movable electrode 12 and the drive electrode 13 on the upper substrate 10 are allowed to face the SiO$_2$ layer 51 of the lower substrate 50. The upper substrate 10 and the lower substrate 50 are hermetically connected in high-temperature high-pressure environments (for example, at 350° C. and 10 atmospheric pressure), thus forming the variable capacitor elements X$_n$ in FIG. 4. While no drive voltage is applied, the spacing between the second fixed electrode 11B and the movable electrode 12 is 2 µm in the illustrated embodiment and is identical with the thickness of the connecting portion 52.

Figure 10:
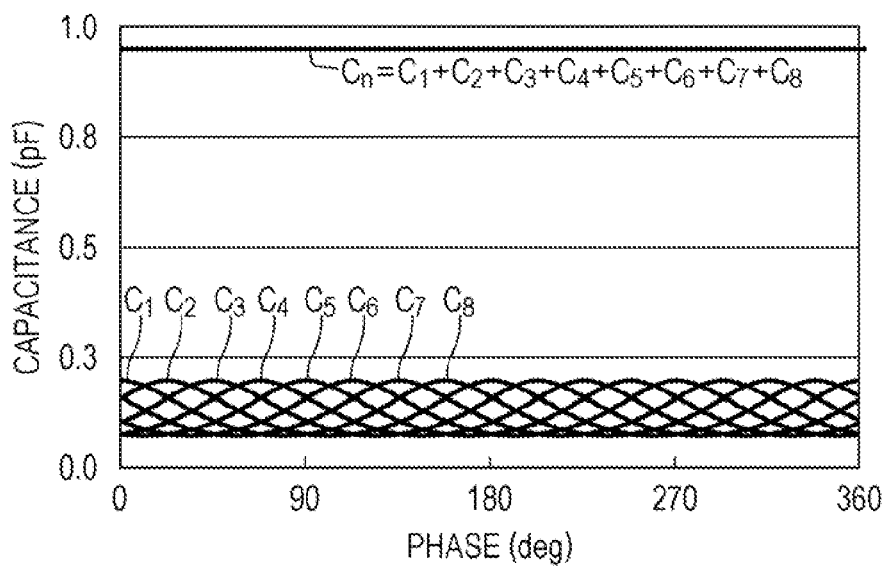
FIG. 10 is a graph illustrating a change in phase of the capacitance of the variable capacitor, driving of the variable capacitor being controlled as illustrated in the timing chart of FIG. 9.

Control of driving of the variable capacitor elements X$_1$ to X$_n$ by the multistage phase shifter Y will now be described with reference to FIGS. 9 and 10. The capacitance (output capacitance) C of the variable capacitor 100 is the sum of the capacitances C$_1$ to C$_n$ of the variable capacitor elements X$_1$ to X$_n$. The phase difference α for each of the phase shift units Y$_1$ to Y$_{n-1}$ of the multistage phase shifter Y may be determined based on α=360° divided by n (the number of variable capacitor elements). FIG. 9 is a timing chart of the control of driving of the eight variable capacitor elements X$_1$ to X$_8$ by the multistage phase shifter Y. In FIG. 9, a state "1" of a drive voltage signal means that an AC drive voltage is applied to the variable capacitor elements X$_1$ to X$_8$ and a state "0" of the drive voltage signal means that the drive voltage is not applied to the variable capacitor elements X$_1$ to X$_8$. The multistage phase shifter Y operates in accordance with a reference pulse signal. Seven phase shift units Y$_1$ to Y$_7$ sequentially apply the drive voltage, supplied from the external AC power supply E, to the eight variable capacitor elements X$_1$ to X$_8$, respectively, with the phase difference α=45°. A pulse interval of one pulse in the reference pulse signal corresponds to the phase difference α=45° for the phase shift units Y$_1$ to Y$_7$. When the eight variable capacitor elements X$_n$ (X$_1$ to X$_8$) are sequentially driven with the phase difference α=45° in the order from n=1 as illustrated in FIG. 9, the output capacitance C of the variable capacitor 100, obtained as the combined capacitance of the capacitances of the eight variable capacitor elements X$_1$ to X$_8$, is smoothed, thus reducing ripple. FIG. 10 is a graph illustrating a change in phase of the capacitance C of the variable capacitor 100 subjected to driving control illustrated in the timing chart of FIG. 9. FIG. 10 demonstrates that the capacitance C of the variable capacitor 100 is substantially constant while ripple is reduced to the range of ±0.3%.

A frequency of the AC drive voltage applied to the variable capacitor elements X$_1$ to X$_n$ can be appropriately set in the range of 1 to 100 kHz. In the embodiment, the frequency may be set to a value near a resonant frequency of the movable electrode 12. In the use of the drive voltage having a frequency near the resonant frequency, the effect of multiplication by the resonance of the movable electrode 12 yields a large displacement. This is advantageous to achieve low-voltage driving. The resonant frequency of the movable electrode 12 is determined by the shape, spring constant, weight, and the like of each beam 10b2. Furthermore, the capacitance C of the variable capacitor 100 can be set to any value depending on the magnitude of a drive voltage applied to the variable capacitor elements $X_1$ to $X_n$.

Figure 11:
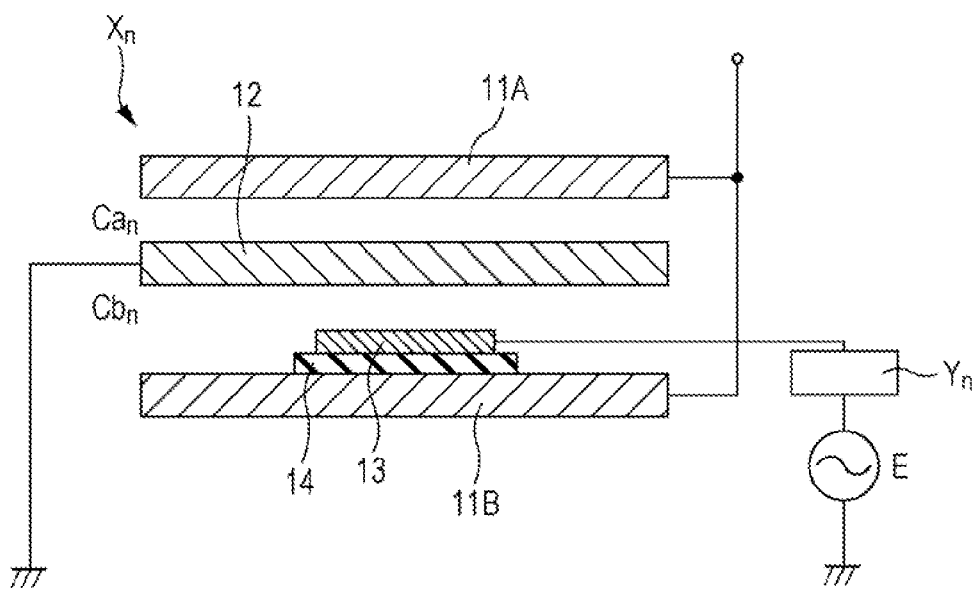
FIG. 11 is a schematic diagram illustrating, in outline, the configuration of a variable capacitor element according to a second embodiment.

FIG. 11 is a schematic diagram illustrating, in outline, the configuration of a variable capacitor element $X_n$ according to a second embodiment. According to the second embodiment, the variable capacitor element $X_n$ includes a pair of first and second fixed electrodes 11A and 11B, a movable electrode (capacitance formation electrode) 12 disposed therebetween, and a drive electrode 13 disposed close to the second fixed electrode 11B, the drive electrode 13 being connected to a multistage phase shifter Y. The second fixed electrode 11B is electrically insulated from the drive electrode 13 by a dielectric layer 14 made of, for example, $SiO_2$. The configuration in the second embodiment is the same as that in the first embodiment, except for the position of the drive electrode 13.

Figure 12:
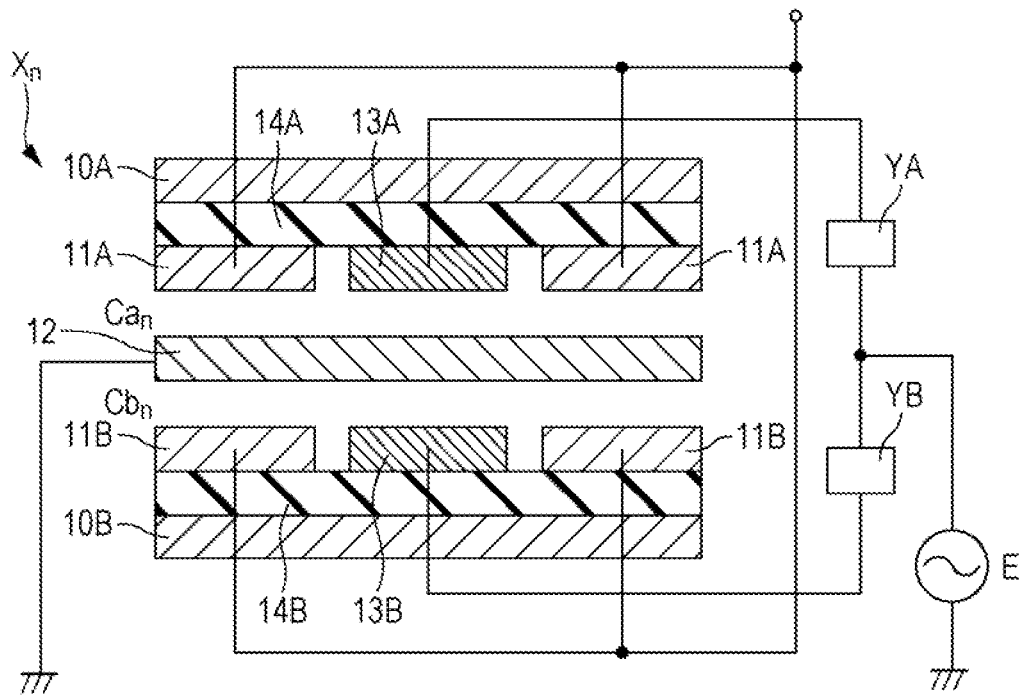
FIG. 12 is a schematic diagram illustrating, in outline, the configuration of a variable capacitor element according to a third embodiment.

FIG. 12 is a schematic diagram illustrating, in outline, the configuration of a variable capacitor element $X_n$ according to a third embodiment. According to the third embodiment, the variable capacitor element $X_n$ includes a pair of first and second fixed electrodes 11A and 11B, a movable electrode (capacitance formation electrode) 12 disposed therebetween, and a pair of first and second drive electrodes 13 (13A and 13B) arranged on the first and second fixed electrodes 11A and 11B, respectively. The first fixed electrode 11A and the first drive electrode 13A are formed on a single Si substrate 10A with a dielectric layer 14A disposed between the substrate and the electrodes, the dielectric layer 14A being made of, for example, $SiO_2$. The first fixed electrode 11A is electrically insulated from the first drive electrode 13A by the dielectric layer 14A. Similarly, the second fixed electrode 11B and the second drive electrode 13B are formed on a single Si substrate 10B with a dielectric layer 14B disposed between the substrate and the electrodes, the dielectric layer 14B being made of, for example, $SiO_2$. The second fixed electrode 11B is electrically insulated from the second drive electrode 13B by the dielectric layer 14B. The first and second drive electrodes 13A and 13B are connected to a first multistage phase shifter YA and a second multistage phase shifter YB, respectively. The first multistage phase shifter YA and the second multistage phase shifter YB apply AC drive voltages 180° out of phase supplied from an external AC power supply E to the first drive electrode 13A and the second drive electrode 13B, respectively. The configuration in the third embodiment is the same as that in the first embodiment, except for the arrangement of the pair of drive electrodes 13 and the pair of multistage phase shifters Y.

Figure 13:
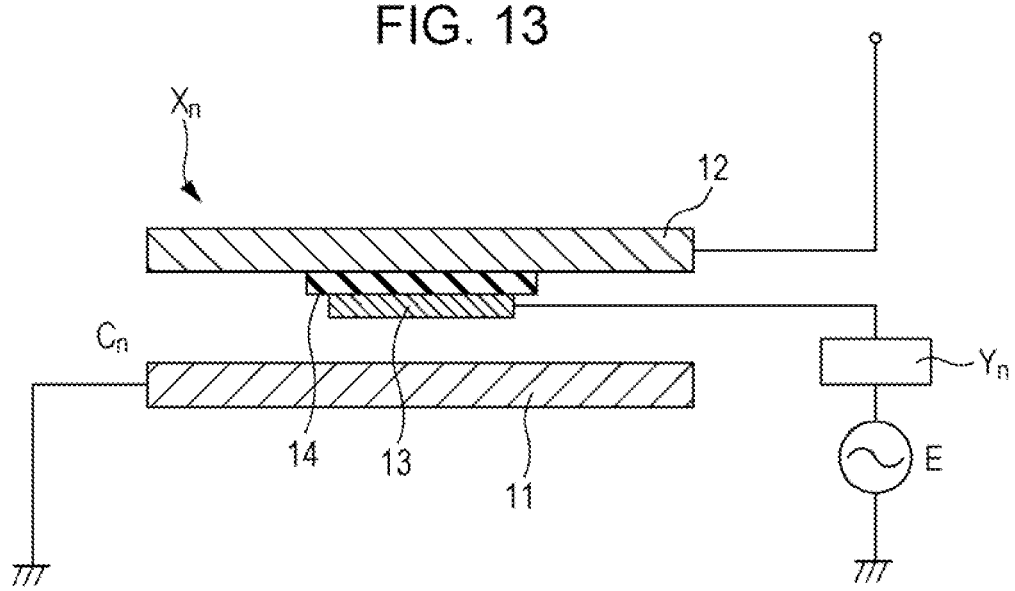
FIG. 13 is a schematic diagram illustrating, in outline, the configuration of a variable capacitor element according to a fourth embodiment.
Figure 14:
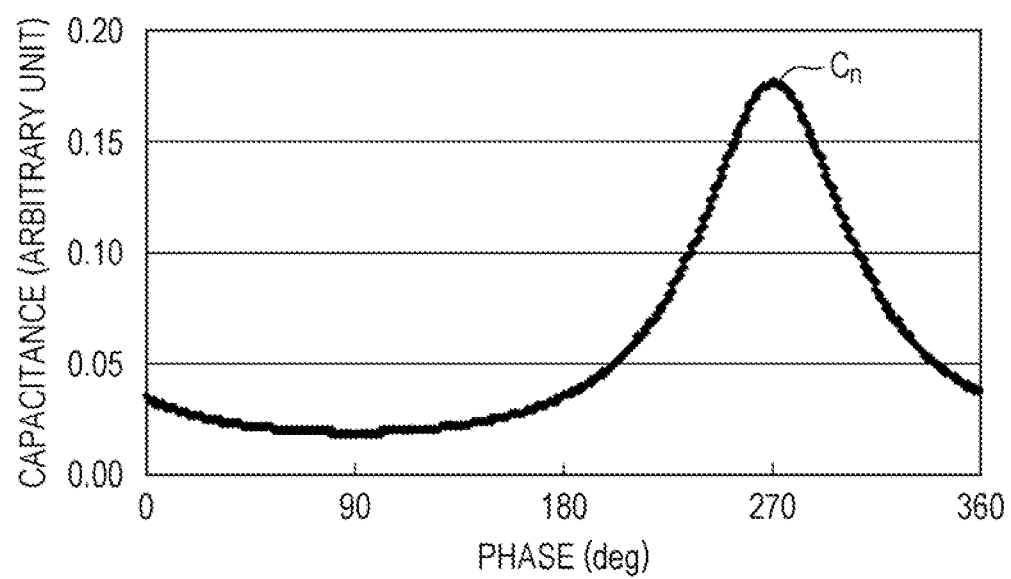
FIG. 14 is a graph illustrating a change in phase of the capacitance of the variable capacitor element of FIG. 13.

FIGS. 13 and 14 illustrate a variable capacitor element $X_n$ according to a fourth embodiment. FIG. 13 is a schematic diagram illustrating, in outline, the configuration of the variable capacitor element $X_n$. According to the fourth embodiment, the variable capacitor element $X_n$ includes a fixed electrode 11 and a movable electrode (capacitance formation electrode) 12 facing each other, and further includes a drive electrode 13 disposed close to the movable electrode 12. The variable capacitor element $X_n$ is of a single-side electrode type. The movable electrode 12 is electrically insulated from the drive electrode 13 by a dielectric layer 14 made of, for example, $SiO_2$. FIG. 14 is a graph illustrating a change in phase of a capacitance $C_n$ of the variable capacitor element $X_n$. A phase difference α for each of phase shift units $Y_1$ to $Y_{n-1}$ of a multistage phase shifter Y is determined based on α=360° divided by n (the number of variable capacitor elements). A timing chart of control of driving of eight variable capacitor elements $X_1$ to $X_8$ by the multistage phase shifter Y is the same as that in the first embodiment illustrated in FIG. 9.

As regards the first to fourth embodiments, the first to third embodiments have an advantage over the fourth embodiment in terms of smoothing of the output capacitance of the variable capacitor 100 with the smaller number n of variable capacitor elements. In the first to third embodiments, the capacitances $C_1$ to $C_n$ of the variable capacitor elements $X_1$ to $X_n$ each have two peak values during one period (360°). On the other hand, in the fourth embodiment, the capacitances $C_1$ to $C_n$ of the variable capacitor elements $X_1$ to $X_n$ each have one peak value during one period (360°).

In each of the above-described embodiments, the variable capacitor elements $X_1$ to $X_n$ are connected in parallel and the AC drive voltage is applied to the variable capacitor elements $X_1$ to $X_n$ with the predetermined phase difference α to control driving of the variable capacitor elements $X_1$ to $X_n$. Accordingly, the output capacitance C of the variable capacitor 100 yielded as the sum of the capacitances of the variable capacitor elements $X_1$ to $X_n$ is smoothed, so that ripple is reduced. Thus, the stable output capacitance C can be obtained even in the use of the AC drive voltage. Advantageously, the capacitor can be easily used as a circuit element.

The use of the AC drive voltage achieves low-voltage driving, which contributes to the low power consumption, small size, and low profile of an apparatus that includes the variable capacitor. Furthermore, when a frequency of the drive voltage is set to a value near the resonant frequency of the movable electrode, a large displacement of the movable electrode can be ensured with a low drive voltage, leading to an increased capacitance change rate. In addition, the use of the AC drive voltage allows creation of a moment at which charging of the dielectric layer is reset (to zero). Accordingly, charging of the dielectric layer can be reduced as compared with that in the use of a DC drive voltage. Advantageously, the movable electrode can be prevented from being attached to the fixed electrode.

Although the invention has been described with respect to the embodiments in which application of the drive voltage generates an electrostatic force between the fixed electrode and the movable electrode and the spacing between the electrodes facing each other is changed by the electrostatic force, the invention can be applied to a case where application of the drive voltage generates a magnetic force or piezoelectric force between the fixed electrode and the movable electrode and the spacing therebetween is changed by the force.

The variable capacitor according to any of the embodiments of the invention can be applied to general portable apparatuses required to have low power consumption, small size, and low profile.

What is claimed is:

1. A variable capacitor comprising:
   a plurality of variable capacitor elements connected in parallel with one another, each of the plurality of variable capacitor elements including:
      a fixed electrode and a movable electrode facing each other;
      a beam configured to desplaceably support the movable electrode; and
      a drive electrode configured to change spacing between the fixed electrode and the movable electrode in accordance with a drive voltage applied thereto; and
   a drive controller configured to sequentially apply an AC drive voltage to the drive electrodes of the plurality of variable capacitor elements with a predetermined phase difference for each variable capacitor element, wherein an output capacitance of the variable capacitor is a sum of capacitances of the plurality of variable capacitor elements.

2. The variable capacitor according to claim 1, wherein the drive controller applies the AC drive voltage to the drive electrode of each variable capacitor element to generate an electrostatic force between the fixed electrode and the movable electrode, thereby changing the spacing between the fixed electrode and the movable electrode.

3. The variable capacitor according to claim 1, wherein each of the plurality of variable capacitor elements includes a dielectric film deposited on at least one of upper or lower surfaces of the fixed electrode or the movable electrode.

4. The variable capacitor according to claim 1, wherein a frequency of the AC drive voltage applied to the drive electrode of each of the plurality of variable capacitor elements is a resonant frequency of the movable electrode determined by the beam or a frequency within a predetermined range from the resonant frequency.

5. The variable capacitor according to claim 1, wherein the drive controller sets the phase difference for each variable capacitor element to 360° divided by a number of the variable capacitor elements.

6. The variable capacitor according to claim 1, wherein the fixed electrode includes a pair of fixed electrodes, and the movable electrode is disposed between the pair of fixed electrode.

* * * * *